(12) United States Patent
Moore

(10) Patent No.: US 7,060,608 B2
(45) Date of Patent: Jun. 13, 2006

(54) SYSTEM AND METHOD FOR FILLING OPENINGS IN SEMICONDUCTOR PRODUCTS

(75) Inventor: Scott E. Moore, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/952,730

(22) Filed: Sep. 30, 2004

(65) Prior Publication Data

US 2005/0048751 A1    Mar. 3, 2005

Related U.S. Application Data

(62) Division of application No. 10/419,818, filed on Apr. 22, 2003, which is a division of application No. 09/471,119, filed on Dec. 23, 1999, now Pat. No. 6,613,105, which is a division of application No. 09/146,519, filed on Sep. 3, 1998, now Pat. No. 6,642,140.

(51) Int. Cl.
    *H01L 21/4763* (2006.01)

(52) U.S. Cl. ........................... 438/631; 29/837

(58) Field of Classification Search ............ 438/631, 438/632, 645, 646, 660; 29/25.01, 589, 837, 29/845
    See application file for complete search history.

(56) References Cited

U.S. PATENT DOCUMENTS

| 3,600,921 | A |   | 8/1971 | Schwarz |
|---|---|---|---|---|
| 3,737,986 | A |   | 6/1973 | Cranston |
| 4,174,624 | A |   | 11/1979 | Shrum |
| 4,471,640 | A |   | 9/1984 | Kortenski et al. |
| 4,832,801 | A |   | 5/1989 | Mori |
| 4,925,501 | A |   | 5/1990 | Harasek |
| 5,061,438 | A |   | 10/1991 | Lillie et al. |
| 5,129,801 | A | * | 7/1992 | Rabin et al. .................... 425/1 |
| 5,434,107 | A |   | 7/1995 | Paranjpe |
| 5,518,771 | A |   | 5/1996 | Jeffreys et al. |
| 5,527,561 | A |   | 6/1996 | Dobson |
| 5,554,257 | A |   | 9/1996 | Yokogawa et al. |
| 5,575,850 | A |   | 11/1996 | Jeffryes et al. |
| 5,866,478 | A |   | 2/1999 | Linliu |
| 6,271,148 | B1 |   | 8/2001 | Kao et al. |
| 6,613,105 | B1 |   | 9/2003 | Moore |
| 6,642,140 | B1 |   | 11/2003 | Moore |

\* cited by examiner

*Primary Examiner*—Phuc T. Dang
(74) *Attorney, Agent, or Firm*—Dickstein Shapiro Morin & Oshinsky LLP

(57) ABSTRACT

Explosive forces are used to fill interconnect material into trenches, via holes and other openings in semiconductor products. The interconnect material may be formed of metal. The metal may be heated prior to the force filling step. The explosive forces may be generated, for example, by igniting mixtures of gases such as hydrogen and oxygen, or liquids such as alcohol and hydrogen peroxide. To control or buffer the explosive force, a baffle may be interposed between the explosions and the products being processed. The baffle may be formed of a porous material to transmit waves to the semiconductor products while protecting the products from contaminants. Various operating parameters, including the flow rate of the fuel and the oxidizing materials, may be positively controlled. In another embodiment of the invention, a piston is used to transmit the explosive force. If desired, an annular space at the periphery of the piston may be maintained at atmospheric pressure to protect against wafer contamination. A compact apparatus for filling holes in semiconductor wafers is also disclosed.

5 Claims, 9 Drawing Sheets

SYSTEM AND METHOD FOR FILLING OPENINGS IN SEMICONDUCTOR PRODUCTS

This is a divisional of U.S. patent application Ser. No. 10/419,818, filed on Apr. 22, 2003, which is a divisional of U.S. patent application Ser. No. 09/471,119, filed on Dec. 23, 1999, now U.S. Pat. No. 6,613,105, which is a divisional of application Ser. No. 09/146,519, filed Sept. 3, 1998, now U.S. Pat. No. 6,642,140, the entire disclosures of which are incorporated herein by reference.

BACKGROUND OF THE INVENTION

1. Field of the Invention

The present invention relates generally to the production of semiconductor products. More particularly, the invention relates to a method of filling trenches, holes and other surface discontinuities in semiconductor products. The invention also relates to an apparatus for forcing conductive metal into openings in semiconductor products.

2. Discussion of the Related Art

A method of filling metal into openings in semiconductor products is described in U.S. Pat. No. 5,527,561 (Dobson). According to the Dobson process, via holes are formed in a semiconductor wafer. An aluminum layer is formed over the holes by sputtering. The aluminum layer is deformed and caused to flow into the holes by high pressure and high temperature. The high pressure is applied by pressurized gas.

The Dobson process has several disadvantages. First, it may not always fill the via holes as desired. The process will not work unless the holes are completely covered over by aluminum. That is, the process will not work if openings in the aluminum layer permit equalization of the pressures inside and outside the holes. Openings in the aluminum layer may be formed during the sputtering process or during the application of high pressure and high temperature.

Another problem with the Dobson process is that it would be difficult to operate efficiently. It takes time to pressurize the gas in the Dobson process. The time it takes to handle the pressurized gas reduces the rate at which wafers can be processed. In addition, the mechanisms that would be used to create and maintain the high pressure are relatively large and complicated.

SUMMARY OF THE INVENTION

The disadvantages of the prior art are overcome to a great extent by the present invention. The invention uses explosive force to fill trenches, via holes and/or other openings or surface discontinuities.

The invention relates to a method of making a semiconductor product. The method includes the steps of providing a conductive layer on an insulating layer, and applying an explosive force to the conductive layer. The explosive force is used to efficiently and reliably drive the conductive material into openings defined in the insulating layer.

According to one aspect of the invention, the conductive material is a malleable metal material. The semiconductor product may be a semiconductor wafer in an intermediate stage of production. The metal material may form electrical interconnects in the wafer.

The explosive force may be provided by a variety of reactive materials and other instrumentalities. In one embodiment of the invention, the explosive force is generated by igniting a mixture of hydrogen and oxygen. In another embodiment of the invention, the reactive materials include alcohol and a suitable oxidizing agent.

To control or buffer the explosive force, a baffle may be interposed between the explosion and the wafer being processed. The baffle may be a solid structure. Alternatively, the wafer may be immersed in liquid or gas. In another embodiment of the invention, a piston is used to transmit and/or regulate the explosive force.

According to another aspect of the invention, the conductive material is softened by preheating, before the explosive force is applied to it.

The present invention also relates to an apparatus for processing semiconductor wafers. The apparatus includes a support member for supporting the wafers and a reaction chamber for containing explosive forces. In a preferred embodiment of the invention, the apparatus also includes a heater for preheating the wafers. In addition, an ignition device may be provided for initiating combustion reactions.

An advantage of the invention is that it may be practiced with compact equipment. The invention does not require bulky, complicated mechanical systems for producing and handling pressurized gas.

Another advantage of the invention is that explosive forces can be generated consistently and rapidly, resulting in faster sequential processing of semiconductor wafers.

Moreover, it has been found that explosive forces, characterized by high energy waves, are preferable to forces produced by gradually increasing gas pressure, in terms of reliably forming high quality electrical interconnects.

The present invention is particularly well suited for filling trenches and holes that have high height to width aspect ratios.

According to one aspect of the invention, a porous baffle may be used to protect semiconductor wafers from contaminants, such as contaminants created by sliding pistons. The baffle may be formed, for example, of sintered stainless steel.

According to another aspect of the invention, a piston with differential surface areas may be used to increase or decrease the intensity of waves applied to the surfaces of the wafers being processed. If desired, an annular space at the periphery of the piston may be maintained at atmospheric pressure to further protect the wafers from contaminants.

An advantage of the present invention is that it can be practiced with both gaseous and liquid fuels and oxidizing materials. According to one aspect of the invention, the oxidizer may be supplied to the reaction chamber under relatively high pressure.

These and other features and advantages of the invention will become apparent from the following detailed description of preferred embodiments of the invention.

DETAILED DESCRIPTION OF PREFERRED EMBODIMENTS

Figure 1:
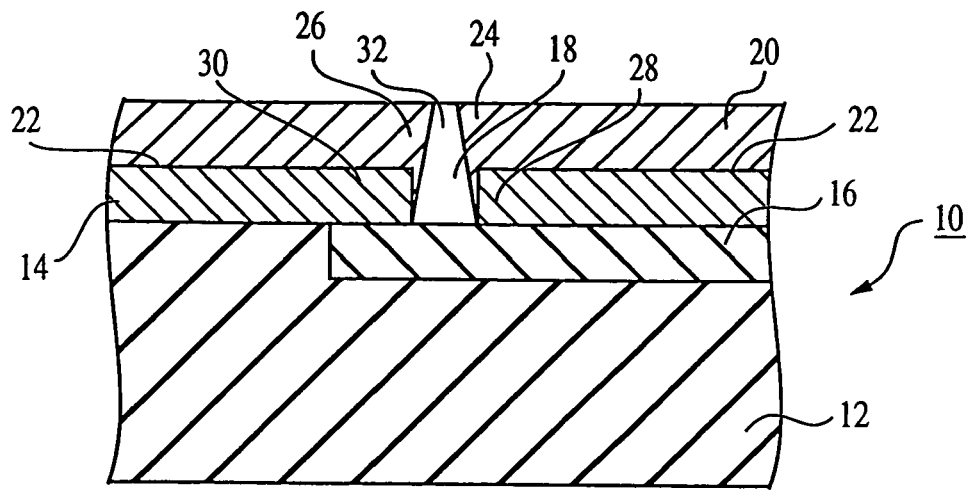
FIG. 1 is a partial cross sectional view of a semiconductor wafer at an intermediate stage of production.

Referring now to the drawings, where like reference numerals designate like elements, there is shown in FIG. 1 a semiconductor wafer 10 in an intermediate stage of production. The wafer 10 has a silicon substrate 12 and an insulating layer 14. The substrate 12 has an active structure 16. The insulating layer 14 has an opening 18 for providing access to the active structure 16. The opening 18 may be a trench, a via hole, a contact well, or any other desired surface discontinuity.

For clarity of illustration, only one opening 18 is shown in the drawings. In practice, the insulating layer 14 may have numerous openings 18 of different shapes and sizes for providing access to a variety of active structures 16 and other devices. The openings 18 may be orthogonal to the insulating layer 14, as shown in the drawings. The invention is also generally applicable, however, to openings that are inclined with respect to the insulating layer 14.

Figure 2:
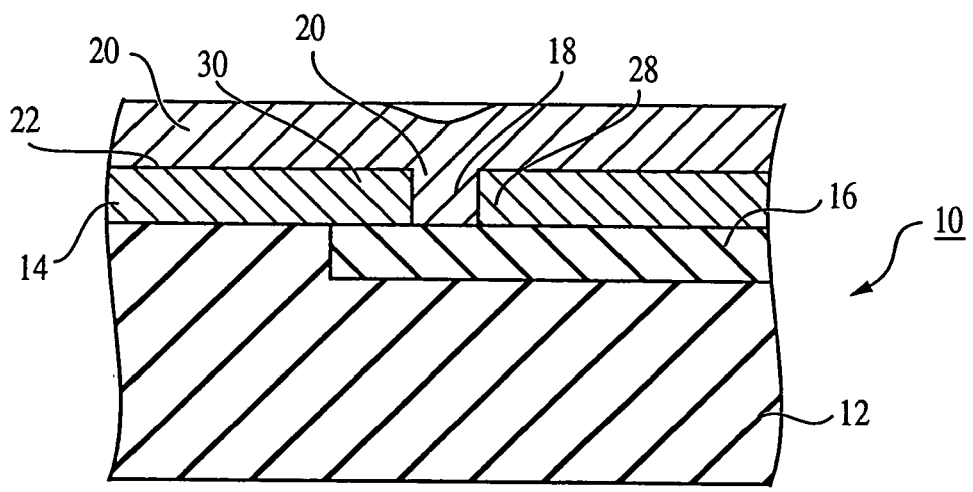
FIG. 2 is a partial cross sectional view of the wafer of FIG. 1 at another stage of production.

In operation, a layer of conductive material 20 is deposited on the upper surface 22 of the insulating layer 14. Then, an explosive force is used to move the conductive material 20 into the opening 18 (FIG. 2). Then, the wafer 10 may be subjected to further processing. For example, the conductive material 20 remaining on the insulating surface 22 may be removed, leaving just the interconnect metal 20 in the opening 18.

The conductive material 20 may be deposited by sputtering, vapor deposition, or by another suitable technique. The deposition process creates ledges 24, 26 (FIG. 1) that extend over the side edges 28, 30 of the opening 18. The ledges 24, 26 define a spacing 32. If the deposition process is continued, the spacing 32 typically becomes closed over. That is, a bridge 34 (FIG. 3) may be formed over the opening 18. The bridge 34 seals the interior of the opening 18 from the atmosphere. The present invention may be used to fill the opening 18 even when the bridge 34 is not fully formed. In particular, an explosive, high energy force may be used to move the ledges 24, 26 (FIG. 1) abruptly into the opening 18 even when the opening 18 is open to the atmosphere.

Figure 3:
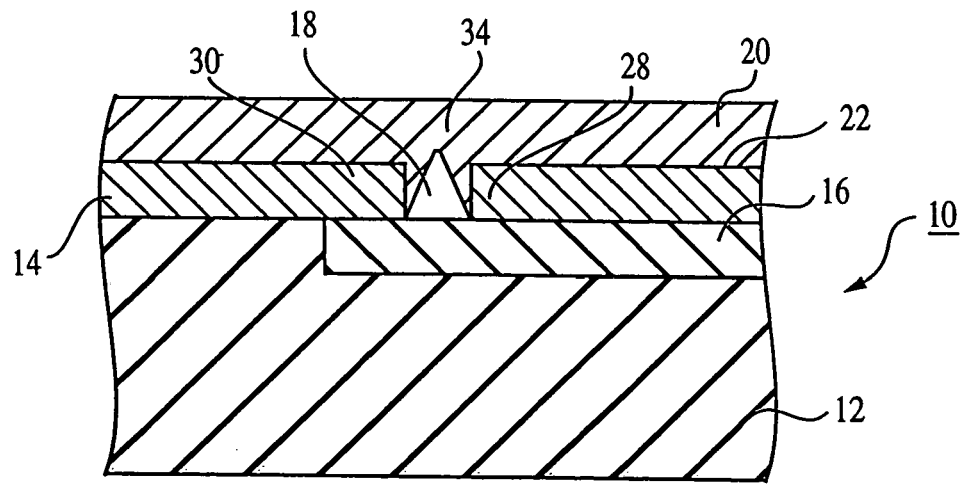
FIG. 3 is a partial cross sectional view of the wafer of FIG. 1 at yet another stage of production.

The present invention should not be limited to the deposition patterns illustrated in FIGS. 1 and 3. Different deposition techniques and different materials tend to cover openings in different ways. The deposition pattern may also be a function of the size and shape of the opening 18, the temperature of the deposited material, and the surface characteristics of the insulating layer 14.

The conductive material 20 is preferably malleable or deformable metal such as aluminum, gold, tungsten, platinum, copper, titanium, nickel, molybdenum, vanadium, and/or alloys thereof. Other materials, including plastic materials, may also be used to practice the invention.

Figure 4:
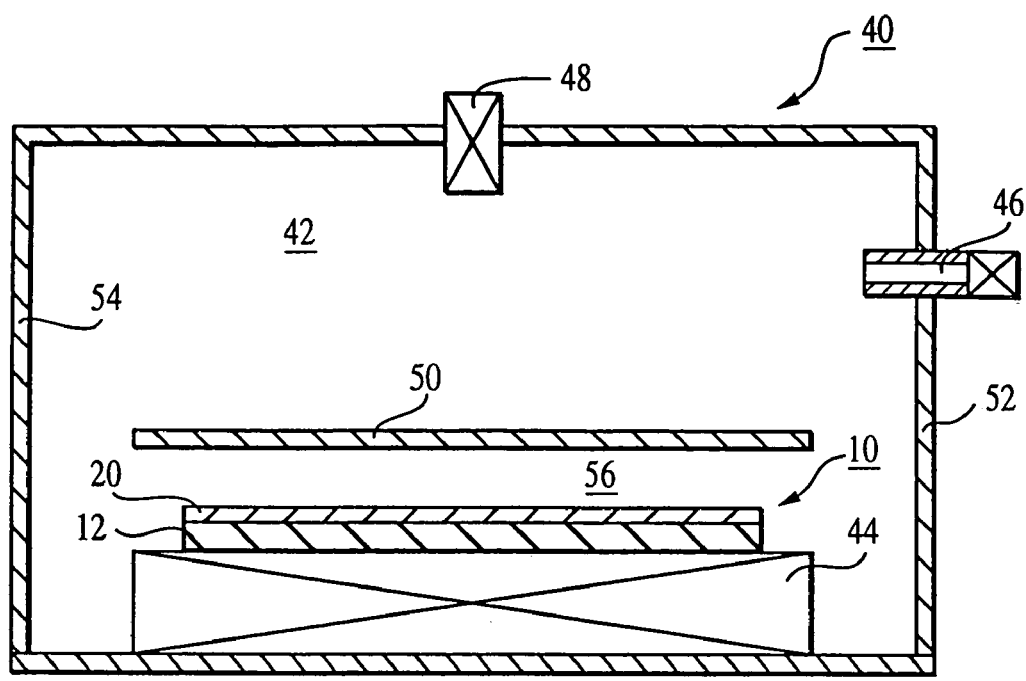
FIG. 4 is a cross sectional view of a wafer handling apparatus constructed in accordance with a preferred embodiment of the present invention.

Referring now to FIG. 4, a filling apparatus 40 constructed in accordance with the invention has a sealed reaction chamber 42, a table 44 for supporting the wafer 10, an inlet/outlet system 46 for supplying a combustible gas mixture, and an igniter 48 for igniting the gas mixture to initiate an explosion. The explosion generates an explosive force that propagates as waves throughout the reaction chamber 42. The explosive force drives the ledges 24, 26 (FIG. 1) or the bridges 34 (FIG. 3) into the respective openings 18. The openings 18 are not shown in FIG. 4 for the sake of clarity.

In the embodiment illustrated in FIG. 4, the combustible gas mixture includes hydrogen and oxygen in amounts that react completely with each other. If desired, a buffering agent may be added to the combustible mixture to promote a smooth but rapid expansion, and to promote clean burning of the combustible mixture. The combustible mixture preferably reacts chemically without producing residual soot or other byproducts that would damage the filling apparatus 40 or contaminate the wafer 10. For example, the reaction byproducts may consist essentially of water vapor. The reaction byproducts may be removed from the reaction chamber 42 by the inlet/outlet system 46.

The term "explosive force," as used herein, is not limited to forces generated by combustion reaction explosions. The term is used herein generally to include any force characterized by high energy waves of the type produced by explosions. In a preferred embodiment of the invention, an explosive force generates a pressure equivalent to about seven hundred to eight hundred atmospheres on the exposed surfaces of the wafer 10. The invention should not be limited to the preferred embodiments illustrated and described in detail herein.

A suitable transport mechanism (not illustrated) may be provided for rapidly moving wafers 10 into and out of the filling apparatus 40. The wafers 10 may be cycled through the apparatus 40 one by one or in groups for batch processing. The movement of the wafers 10 may be synchronized with the ignition of the combustible gas mixture. A suitable programmable control device (not illustrated) may be connected to the transport mechanism, the inlet/outlet system 46 and the igniter 48 for high speed, synchronized operation.

The illustrated filling machine 40 has a baffle 50. The baffle 50 is an optional piece of equipment. The filling machine 40 may be operated without the baffle 50, if desired.

The baffle 50 may be used to regulate and/or smooth out the impact of the compression waves applied to the conductive material 20. The baffle 50 provides flexibility for the operator in terms of the amounts and types of explosive materials that may be employed in the reaction chamber 42. That is, the baffle 50 makes it possible to initiate high intensity explosions in the reaction chamber 42 without damaging the wafer 10. It may be more economical to permit such high intensity explosions than to operate without the baffle 50.

The illustrated baffle 50 is formed of a suitable solid material such as an elastomeric material or metal. The baffle 50 may be supported by the walls 52, 54 of the filling machine 40. In the illustrated embodiment, the baffle 50 is a flexible diaphragm. Pressurized argon or another suitable inert gas may be located in the area 56 between the baffle 50 and the wafer 10.

The table 44 may be provided with a heater for preheating the wafer 10 or for maintaining the temperature of the wafer 10. The wafer 10 is preferably preheated to soften the metal material 20. In a preferred embodiment of the invention, the wafer 10 is preheated to a temperature of about five hundred to six hundred degrees Fahrenheit.

Figure 5:
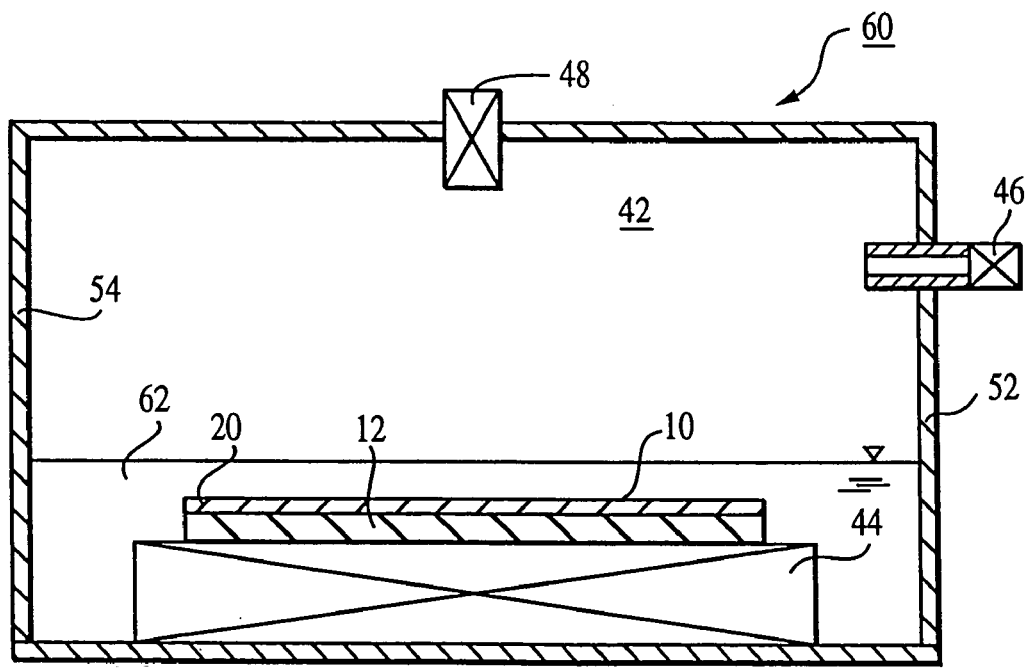
FIG. 5 is a cross sectional view of another wafer handling device constructed in accordance with the present invention.

A second filling machine 60 constructed in accordance with the invention is shown in FIG. 5. The second filling machine 60 is essentially the same as the filling machine 40 shown in FIG. 4, except that the second filling machine 60 has a liquid baffle. The liquid baffle may be formed of de-ionized water 62 located in the bottom of the reaction chamber 42. The wafer 10 may be completely immersed in the water 62. The liquid baffle (or water blanket) 62 may be used to dampen, reduce and/or smooth out the impact of the explosive forces generated in the reaction chamber 42. The liquid baffle 62 may also protect the wafer 10 by providing a physical barrier against contaminants.

If desired, the liquid baffle 62 may be replaced with a baffle formed of heavy gas. The term "heavy gas" means gas that is substantially more dense than the combustible gas mixture. The heavy gas would tend to collect at the bottom of the filling machine 60, causing the combustible gas mixture to remain near the top of the reaction chamber 42 (in the vicinity of the igniter 48) prior to exploding. The gas baffle may be used to ensure that the combustible gas mixture is located near the igniter 48 during ignition. The gas baffle may also protect the wafer 10 by isolating the wafer 10 from reactive chemicals.

Figure 6:
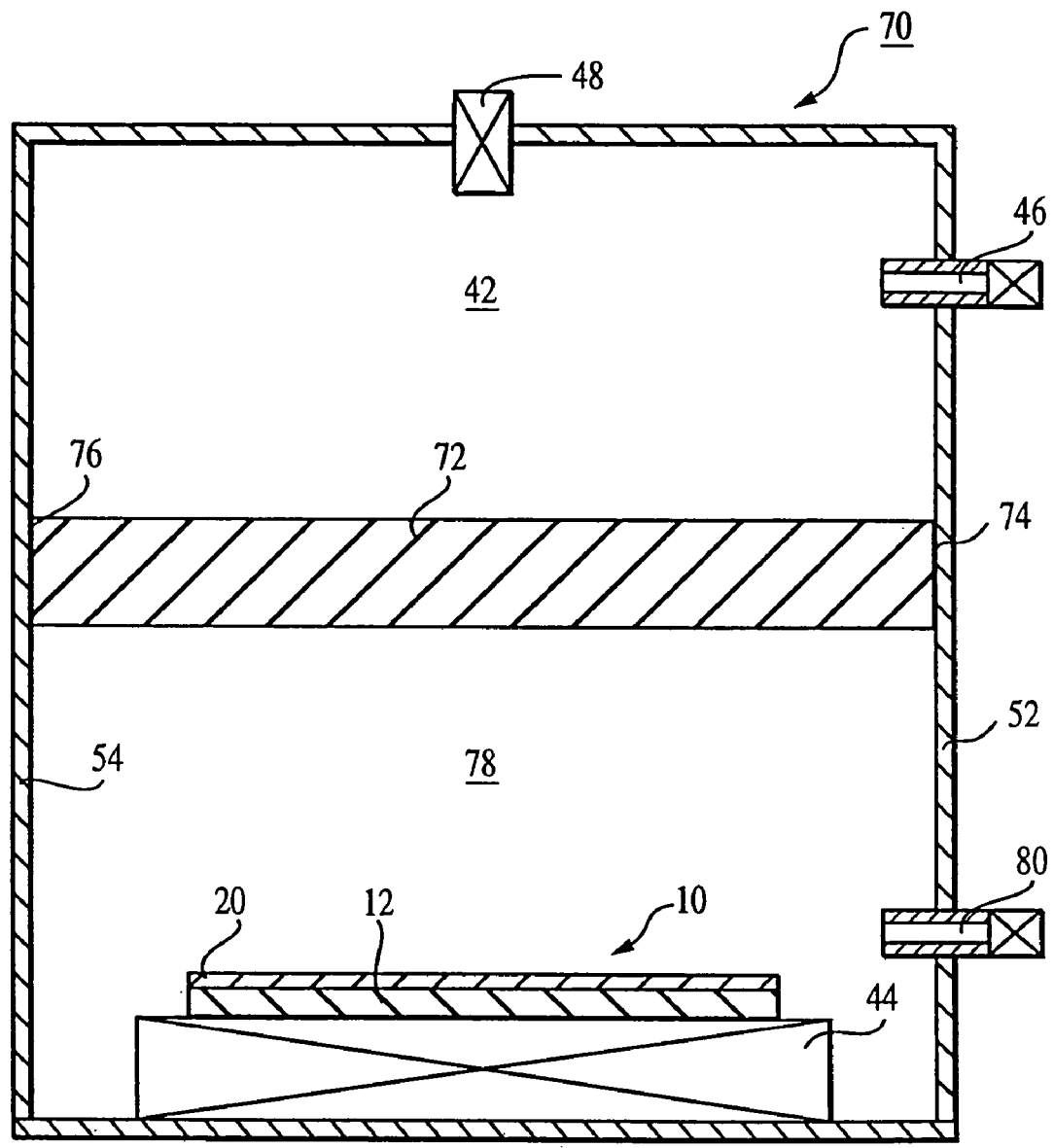
FIG. 6 is a cross sectional view of yet another wafer handling device constructed in accordance with the present invention.

Referring now to FIG. 6, a third filling machine 70 may be constructed with a ram piston 72. The edges 74, 76 of the piston 72 are slidably sealed to the walls 52, 54 of the filling apparatus 70. The combustible gas mixture may be located in a reaction chamber 42 above the piston 72. A compressible inert gas may be located below the piston 72. The inert gas surrounds and protects the wafer 10. The piston 72 helps prevent contamination of the wafer 10 and isolates the wafer 10 from reactive materials.

In operation, an explosion is initiated in the reaction chamber 42. The explosion causes the piston 72 to move rapidly downward toward the wafer 10. The rapid downward movement of the piston 72 causes a sudden compression of the inert gas, initiating a high energy wave that impacts the ledges 24, 26 (FIG. 1) and thereby force fills the conductive material 20 into the openings 18.

The downward movement of the piston 72 may be stopped at a desired location by a suitable stop mechanism (not illustrated). In addition, the piston 72 may be biased upward by a compression spring (not illustrated). When the combustion products are withdrawn from the reaction chamber 42 through the inlet/outlet system 46, the compression spring returns the piston 72 to the start position shown in FIG. 6.

The inert gas in the lower chamber 78 (beneath the piston 72) may be precharged. For example, the lower chamber 78 may be pressurized to an initial pressure of about two thousand to three thousand pounds per square inch. The precharging may eliminate the need for the compression spring. In addition, pressurizing the gas in the lower chamber 78 may facilitate the rapid formation of intense compression waves. The pressure in the lower chamber 78 may be maintained by a suitable inlet/outlet mechanism 80.

Figure 7:
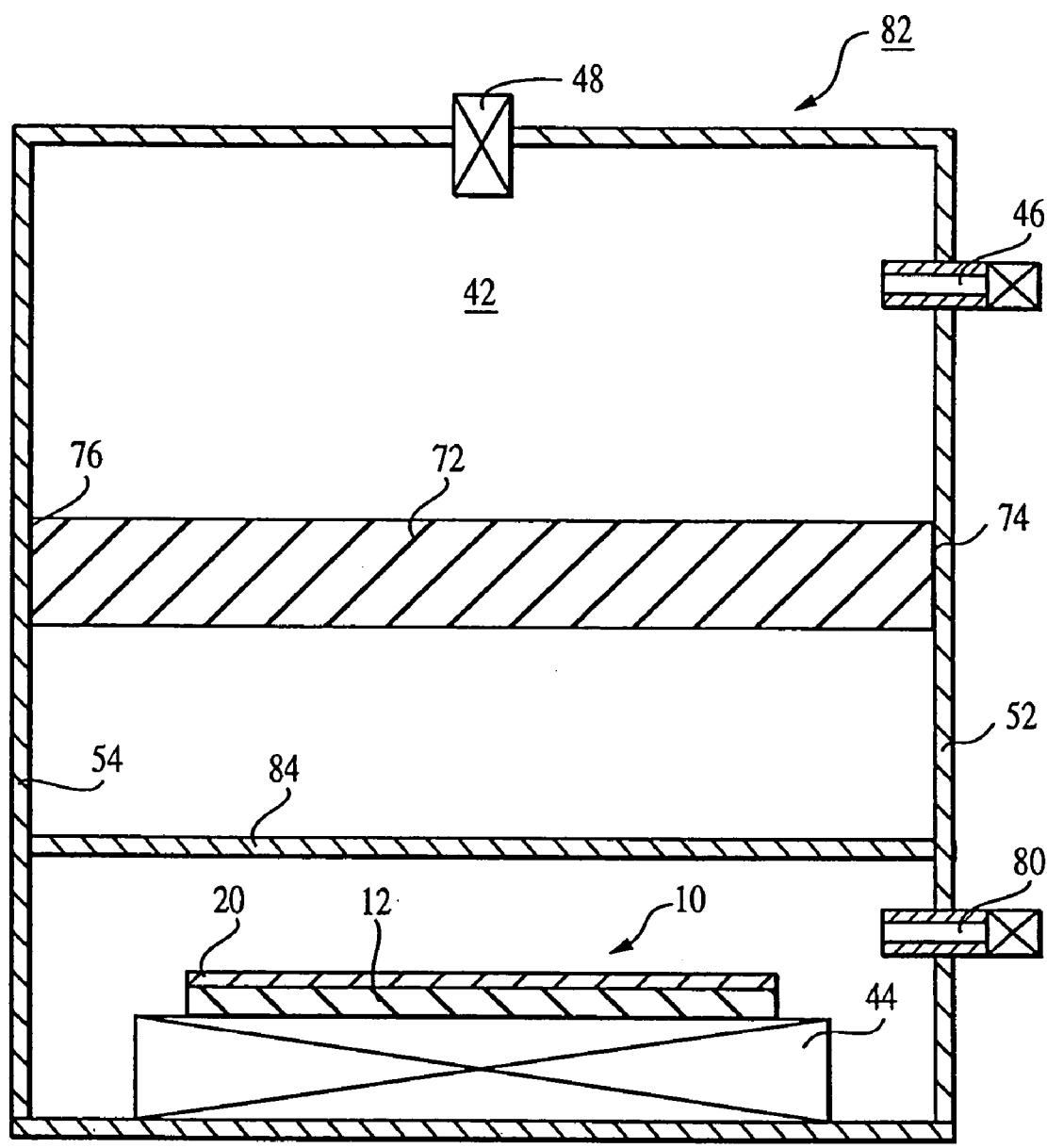
FIG. 7 is a cross sectional view of yet another wafer handling device constructed in accordance with the present invention.

As shown in FIG. 7, a filling machine 82 may be provided with a baffle 84 for protecting the wafer 10. The baffle 84 may be formed of porous filter media. The baffle 84 may be used to prevent contaminants from falling on the wafer 10. The contaminants may be produced, for example, by frictional wear between the piston edges 74, 76 and the contacting walls 52, 54. The high energy waves transmitted by the piston 72 are propagated through the pores in the porous baffle 84. The porous baffle 84 may be formed, for example, of sintered stainless steel having pores that are about one-half micron or less in diameter.

Figure 8:
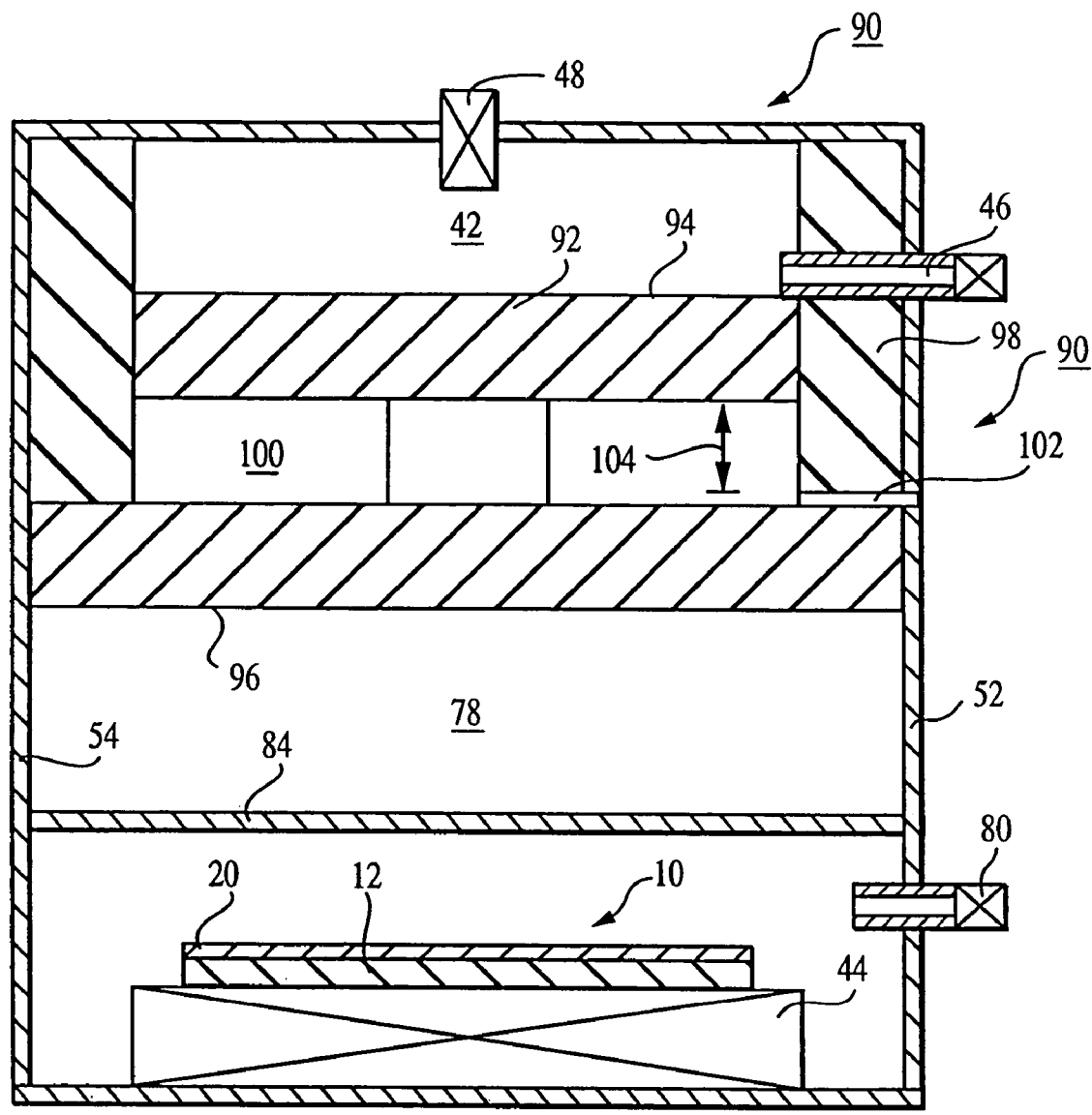
FIG. 8 is a cross sectional view of yet another wafer handling device constructed in accordance with the present invention.

FIG. 8 shows a fifth filling apparatus 90 constructed in accordance with the invention. The illustrated apparatus 90 has a differential piston 92 with first and second piston surfaces 94, 96. The surface area of the first surface 94 is smaller than the surface area of the second surface 96. The first surface 94 is slidably sealed within a fixed cylinder 98. The differential piston 92 reduces the intensity of the explosive force applied to the wafer 10.

The annular space 100 between the two platens 94, 96 may be maintained at atmospheric pressure. A vent 102 may provide fluid communication between the space 100 and the exterior of the device 90. The vent 102 and the space 100 may be used to isolate the combustion chamber 42 from the lower chamber 78. That is, the space 100 may be used to prevent combustion or reaction products from seeping into the lower chamber 78. By maintaining the pressure in the lower chamber 78 above atmospheric pressure, contaminants located at the edge of the lower platen 96 are urged upwardly toward the annular space 100. The piston travel distance 104 may be selected such that the vent 102 is never covered by the top platen 94. The fifth filling apparatus 90 may be constructed either with or without the porous plate 84.

Figure 9:
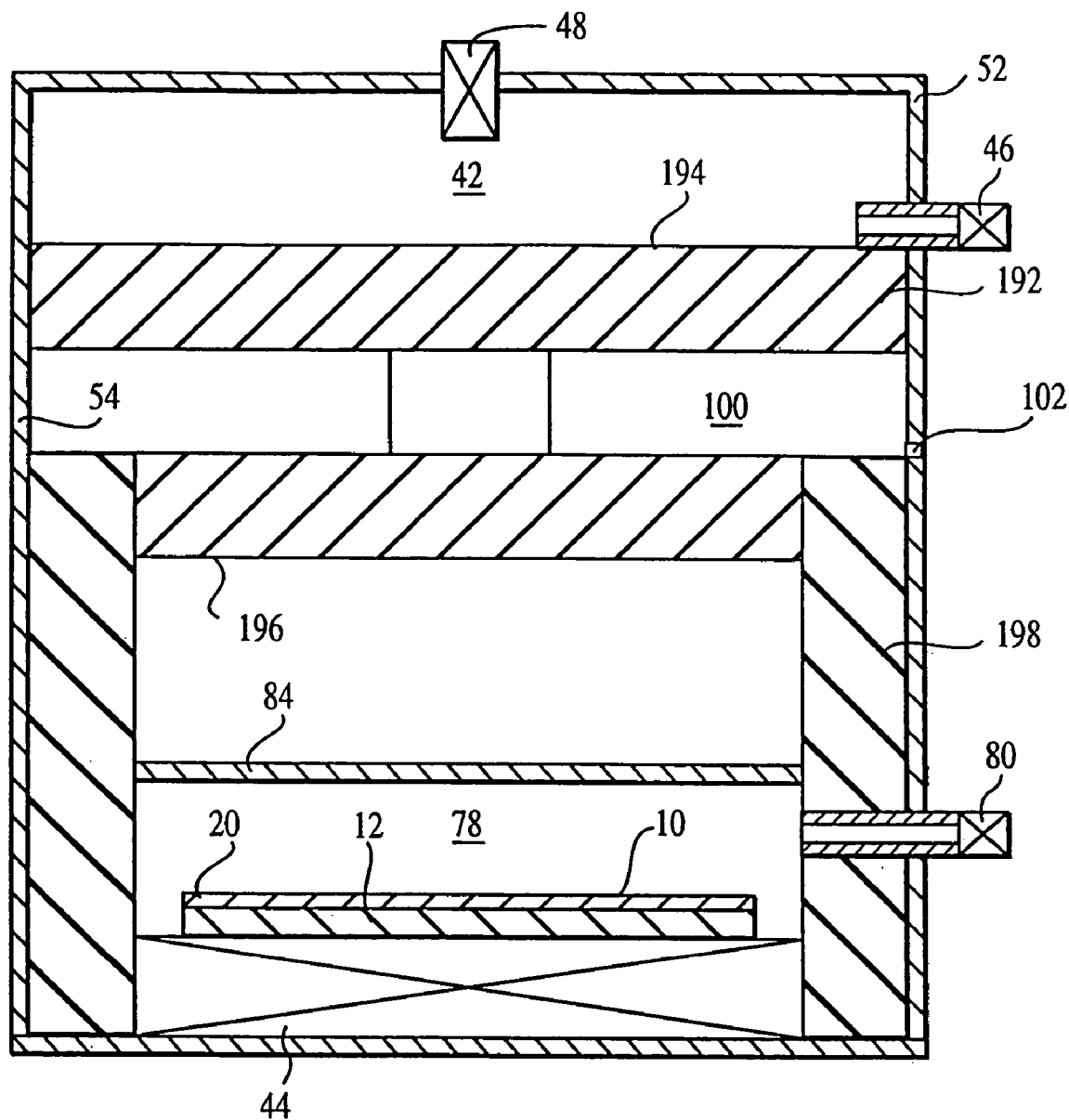
FIG. 9 is a cross sectional view of yet another wafer handling device constructed in accordance with the present invention.

Referring now to FIG. 9, a sixth filling apparatus constructed in accordance with the invention has a differential piston 192 with first and second piston surfaces 194, 196. The first surface 194 has a greater diameter (and surface area) than the second surface 196. The second surface 196 is slidably sealed within a fixed cylinder 198. The space 100 between the platens 194, 196 may be maintained at atmospheric pressure as in the apparatus of FIG. 8. The differential piston 192 (FIG. 9) increases the intensity of the explosive force supplied to the wafer 10.

Figure 10:
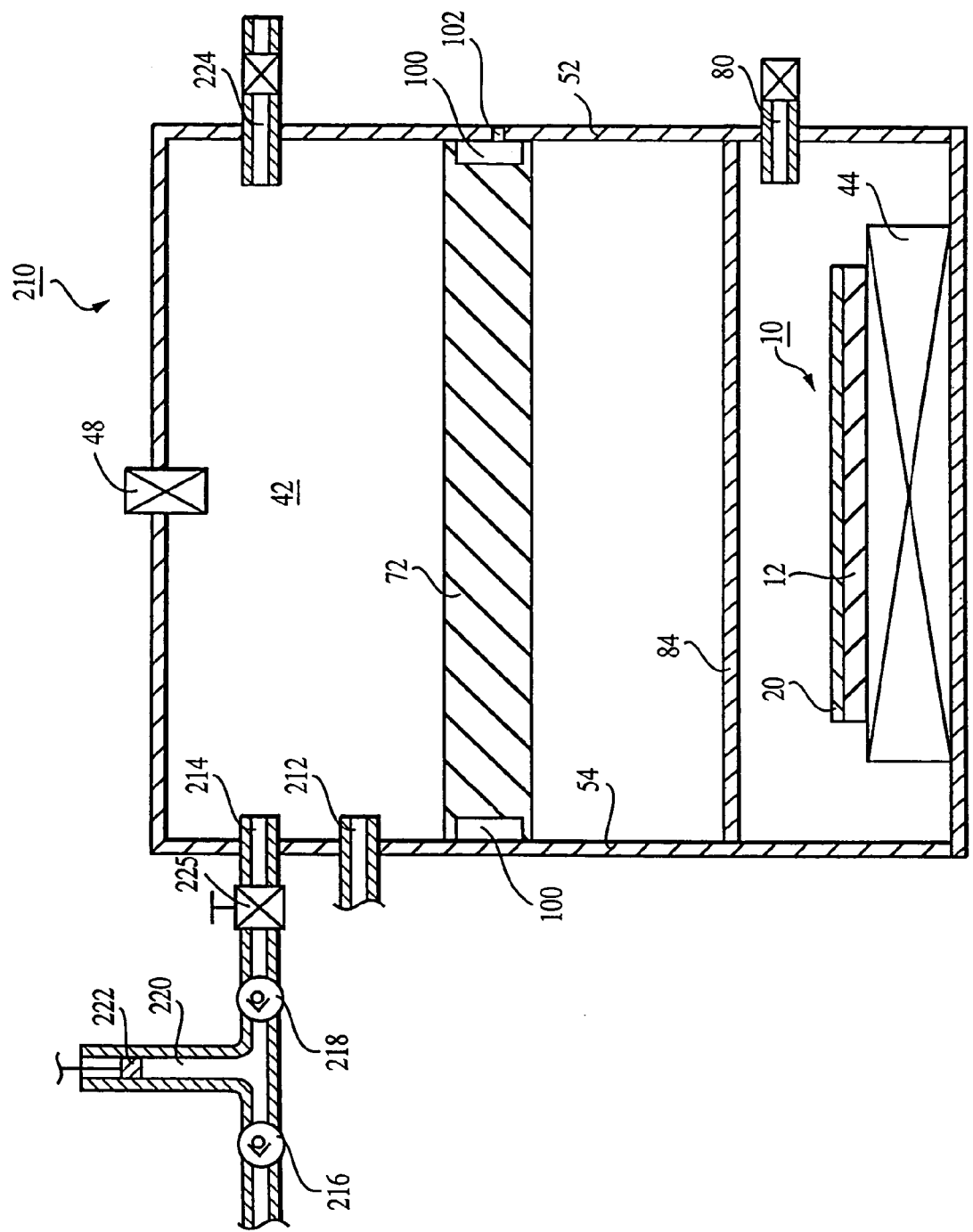
FIG. 10 is a cross sectional view of yet another wafer handling device constructed in accordance with the present invention.

A seventh filling apparatus 210 is shown in FIG. 10. The seventh filling apparatus 210 operates with liquid reactants. A liquid fuel is introduced into the reaction chamber 42 through a first input pipe 212. The fuel may be, for example, alcohol. The fuel may be introduced at relatively low pressure. A liquid oxidizer (for example, hydrogen peroxide) flows into the reaction chamber 42 at a higher pressure through a second inlet 214. The oxidizer is pressurized by a pressurizing system that includes first and second one-way valves 216, 218 and a high pressure reciprocating syringe type pump 220. The pump 220 may have a reciprocating plunger 222 for applying pressure to the oxidizer. An exhaust valve 224 is provided for cyclically removing the reaction products from the reaction chamber 42. The pump 220 may be used to control the pressure and feed rate of the oxidizer to thereby control the reaction rate in the reaction chamber 42.

A metering orifice 225 may be located in the inlet line 214 to control the feed rate of reactant flowing into the reaction chamber 42. The metering orifice 225 may be operatively connected to a suitable programmable controller and/or transducers (described in more detail below).

Figure 11:
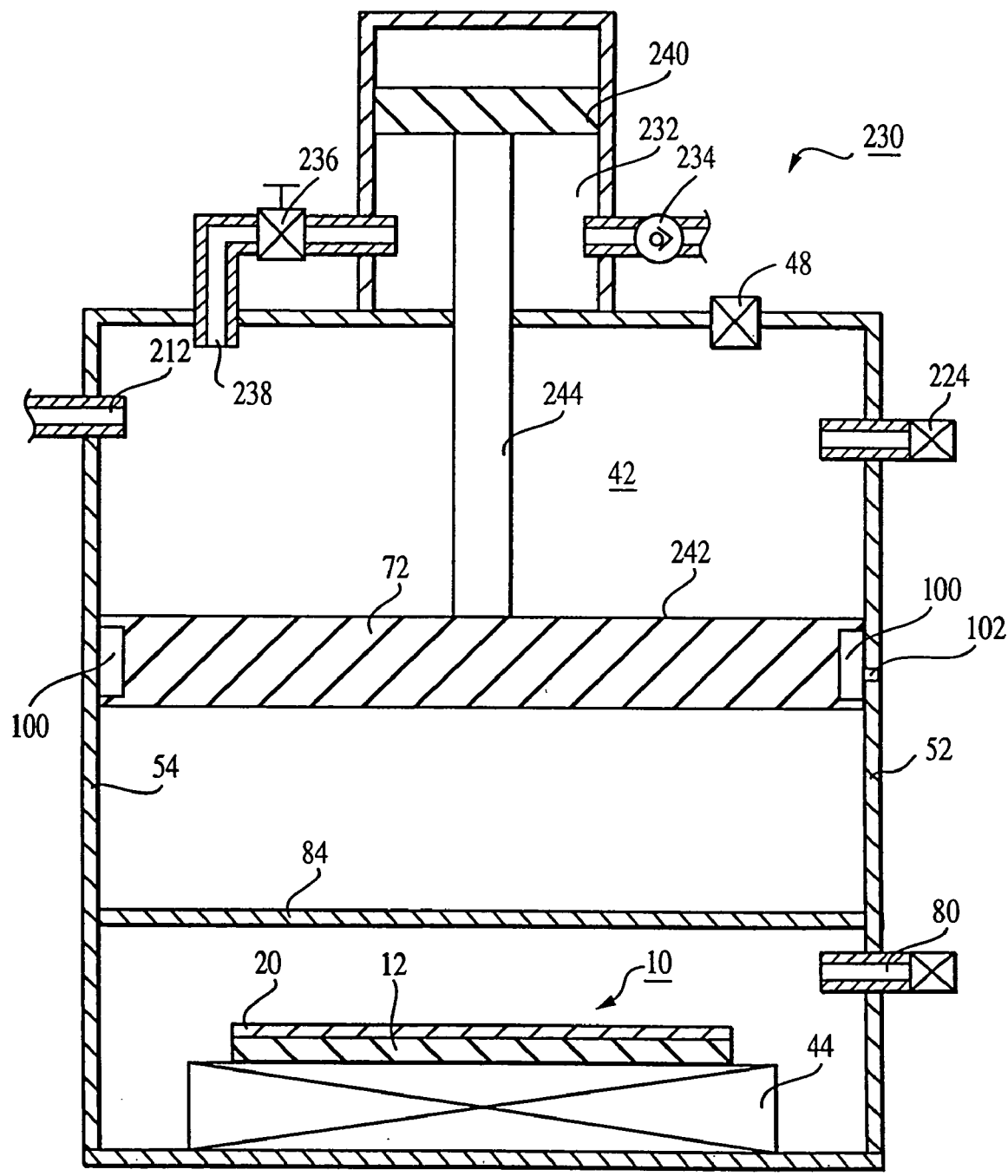
FIG. 11 is a cross sectional view of yet another wafer handling device constructed in accordance with the present invention.

Referring now to FIG. 11, there is shown an eighth filling apparatus 230 constructed in accordance with the present invention. The illustrated apparatus 230 has a high pressure injection chamber 232 located above the reaction chamber 42. As in the embodiment described above, fuel (such as alcohol) flows into the reaction chamber 42 at relatively low pressure (for example, atmospheric pressure) through a first inlet 212. The oxidizer flows through a first check valve 234, a metering orifice 236, and then through a second inlet 238 into the reaction chamber 42. The injection chamber 232 has a second piston 240. The second piston 240 is integrally connected to the main piston 72, for example, by a sealed piston rod 244. A cyclically operating exhaust valve 224 is provided as in the embodiment of FIG. 10.

In operation, as an explosive reaction occurs in the reaction chamber 42, the second piston 240 moves downward with the main piston 72. The downward movement of the injection piston 240 creates high pressure in the injection chamber 232. The high pressure causes the oxidizer to flow through the metering orifice 236 into the reaction chamber 42.

The metering orifice 236 may be used to control the rate at which the reactants (the fuel and the oxidizer) are mixed. The rate at which the reactants are mixed may be the same as in the syringe pump embodiment of FIG. 10. If desired, the pressure, temperature, and change of volume in the reaction chamber 42 may be controlled by a suitable programmable controller (not illustrated). Transducers (not illustrated) may be provided to measure the pressure, temperature and displacement of the lower surface 242 of the reaction chamber 42. The controller may be programmed with a feedback system to control the operational parameters as desired.

Figure 12:
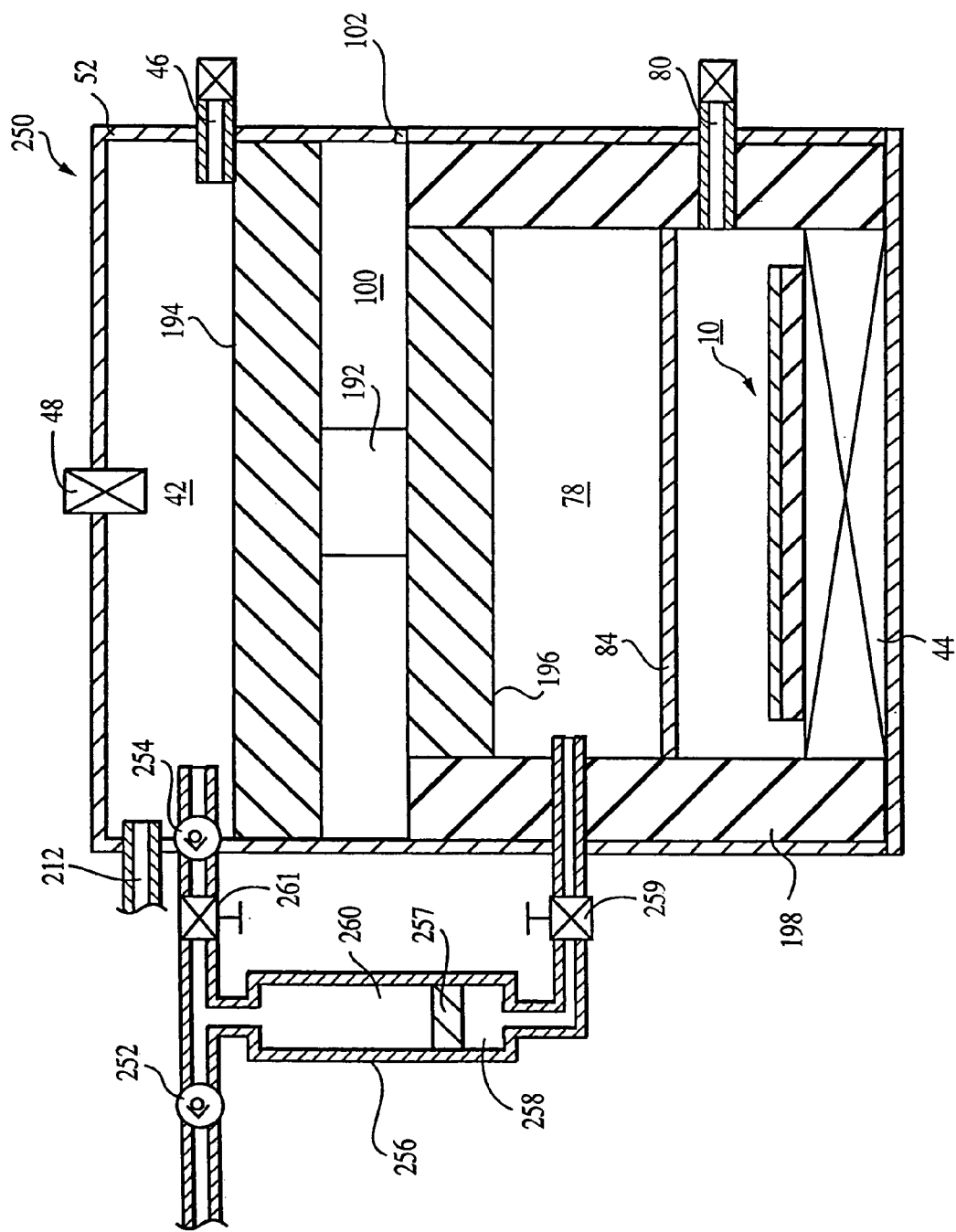
FIG. 12 is a cross sectional view of yet another wafer handling device constructed in accordance with the present invention.

FIG. 12 illustrates another filling apparatus 250 constructed in accordance with the invention. The filling apparatus 250 has a differential piston 192 like the one shown in FIG. 9. The apparatus 250 is adapted to operate on liquid fuel. The liquid fuel is introduced into the reaction chamber 42 by a suitable inlet 212. The inlet 212 may be connected to a suitable upstream source of fuel (not shown). The oxidizer, which may also be a liquid, is introduced through one-way valves 252, 254 that are connected together in series. In addition, a pressure accumulator 256 may be provided between the one-way valves 252, 254. The lower chamber 258 of the accumulator 256 is in fluid communication with the space 78 beneath the differential piston 192.

In operation, as an explosive reaction is initiated in the reaction chamber 42, an operating pressure is applied to the upper chamber 260 of the accumulator 256 by the increasing pressure in the space 78 beneath the piston 192. The operating pressure causes the oxidizer accumulated in the upper portion 260 of the accumulator 256 to flow through the second one-way valve 254 and into the reaction chamber 42.

The oxidizer flows into the reaction chamber 42 because of the difference in pressure created by the differential piston 192. If desired, the piston 192 may be replaced by a piston having equal surface area on both sides. In this alternative embodiment, a differential piston arrangement may be provided in the accumulator 256, instead of the illustrated cylindrical piston 257, to cause the reactant to flow into the reaction chamber 42.

As in the previously described embodiments, suitable transducers and a feedback system may be provided for controlling the temperature, fuel and oxidizer flow rates, temperature and displacement of the piston 192 to achieve the desired pressure waves for processing the wafer 10. If desired, the feedback system may be operatively connected to one or more metering orifices 259, 261. The metering orifices 259, 261 may be used to control the feed rate of reactant into the reaction chamber 42.

In each of the above-described embodiments, a suitable cooling apparatus or heat dissipation apparatus may be provided for the reaction chamber 42 and/or other parts of the system. Thus, for example, systems constructed in accordance with the invention may employ suitable fluid coolant and/or fins for dissipating heat.

An important advantage obtained with the present invention is that a large amount of energy may be obtained using a small amount of combustible materials, which may be gas or liquid.

For most wafer products, a single application of explosive force should be sufficient to produce high quality interconnects in the openings 18. For other products, such as wafers that have non-orthogonal openings, or where indirect infusion of metal is required, it may be desirable to apply successive force waves to complete the filling operation.

The above descriptions and drawings are only illustrative of preferred embodiments which achieve the features and advantages of the present invention, and it is not intended that the present invention be limited thereto. Any modification of the present invention which comes within the spirit and scope of the following claims is considered part of the present invention.

What is claimed as new and desired to be protected by Letters Patent of the United States is:

1. An apparatus for processing semiconductor wafers, said apparatus comprising:
   a support member for supporting a semiconductor wafer; and
   a reaction chamber for applying an explosive force to the semiconductor wafer;
   an ignition device for initiating a combustion reaction in said reaction chamber; and
   a piston for transmitting the explosive force to the semiconductor wafer, said piston being movably located between said ignition device and said support member.

2. The apparatus of claim 1, further comprising an inlet/outlet system for precharging a space between the semiconductor wafer and said piston.

3. An apparatus for processing semiconductor wafers, said apparatus comprising:
   a support member for supporting a semiconductor wafer; and
   a piston for transmitting energy from an explosive force to the semiconductor wafer, said piston having a first surface for receiving the explosive force, and a second surface for applying a high energy wave to the semiconductor wafer, and wherein the surface area of the first surface is different than the surface area of the second surface.

4. The apparatus of claim 3, further comprising a reaction chamber opposed to said piston, and an inlet for flowing liquid fuel into said reaction chamber.

5. The apparatus of claim 4, further comprising an exhaust valve for removing reaction products from said reaction chamber.

* * * * *